United States Patent [19]

Sakai et al.

[11] Patent Number: 4,682,196

[45] Date of Patent: Jul. 21, 1987

[54] MULTI-LAYERED SEMI-CONDUCTOR PHOTODETECTOR

[75] Inventors: Kazuo Sakai, Tokyo; Yuichi Matsushima, Tokorozawa; Shigeyuki Akiba, Tokyo; Katsuyuki Utaka, Musashino, all of Japan

[73] Assignee: Kokusai Denshin Denwa Kabushiki Kaisha, Shinjuku, Japan

[21] Appl. No.: 806,746

[22] Filed: Dec. 9, 1985

Related U.S. Application Data

[63] Continuation of Ser. No. 557,650, Dec. 2, 1983, abandoned.

[30] Foreign Application Priority Data

Dec. 7, 1982 [JP] Japan .............................. 57-213301
Dec. 7, 1982 [JP] Japan .............................. 57-213302

[51] Int. Cl.⁴ .................. H01L 27/14; H01L 29/205; H01L 29/12
[52] U.S. Cl. ...................................... 357/30; 357/58; 357/16; 357/52; 357/56
[58] Field of Search ................ 357/58, 50 E, 50 F, 357/50 J, 16, 52, 4, 67, 52 D, 30, 56

[56] References Cited

U.S. PATENT DOCUMENTS

| | | | |
|---|---|---|---|
| 3,984,858 | 10/1976 | Cornu et al. | 357/58 X |
| 4,000,506 | 12/1976 | Hirai et al. | 357/16 X |
| 4,163,237 | 7/1979 | Dingle et al. | 357/16 |
| 4,231,050 | 10/1980 | Casey, Jr. et al. | 357/17 X |
| 4,326,211 | 4/1982 | Smeets | 357/13 X |
| 4,373,252 | 2/1983 | Caldwell | 357/91 X |
| 4,388,633 | 6/1983 | Vasudev | 357/61 X |
| 4,410,902 | 10/1983 | Malik | 357/13 |
| 4,438,447 | 3/1984 | Copeland, III et al. | 357/16 X |

Primary Examiner—Gene M. Munson
Assistant Examiner—William A. Mintel
Attorney, Agent, or Firm—Robert E. Burns; Emmanuel J. Lobato; Bruce L. Adams

[57] ABSTRACT

A semiconductor device, which is formed by a sequential lamination of a first semiconductor layer having a carrier concentration more than $10^{17}$ cm$^{-3}$, a second semiconductor layer having a carrier concentration less than $10^{16}$ cm$^{-3}$, a third semiconductor layer having a carrier concentration more than $10^{17}$ cm$^{-3}$ and a thickness less than 300 Å, a fourth semiconductor layer having a carrier concentration less than $10^{16}$ cm$^{-3}$, and a fifth semiconductor layer having a carrier concentration more than $10^{17}$ cm$^{-3}$ and, in which the first and fifth semiconductor layers are the same in conductivity type and the third semiconductor layer is different in conductivity type from the fifth semiconductor layer. In accordance with the present invention, the energy gap of the third semiconductor layer is larger than the energy gaps of the second and fourth semiconductor layers. An annular region of a semi-insulating material or of the same conductivity type as that of the third semiconductor layer may be formed around an active region to extend from the fifth semiconductor layer to the second semiconductor layer.

3 Claims, 9 Drawing Figures

MULTI-LAYERED SEMI-CONDUCTOR PHOTODETECTOR

This is a continuation of application SAKAI ET AL., Ser. No. 557,650, now abandoned.

BACKGROUND OF THE INVENTION

The present invention relates to a device with an n-i-p-i-n doping configuration. The invention is also similarly applicable to a p-i-n-i-p configuration but will be described as being applied to the n-i-p-i-n structure, for the sake of brevity.

The n-i-p-i-n device is one that has a thin p-layer about 100 Å formed in an i layer of an n-i-n structure, and is now being emloyed as a high-speed device since it is a device in which mainly majority carriers take part in conduction. Moreover, there has also been recently proposed a three-terminal element utilizing this structure. Further, this device can also be employed as a high sensitivity photo detector with no excess noise and has very wide applications as a very high-gain, high speed photo detector. However, the conventional structure of the type has a defect, such as a large dark current under light irradiation.

SUMMARY OF THE INVENTION

An object of the present invention is to provide a semiconductor device capable of permitting the reduction of the reverse current (the dark current) without introducing any difficult problems by increasing the height of a potential barrier against majority carriers.

To attain the above object of the present invention, there is provided a semiconductor device, which is formed by a sequential lamination of a first semiconductor layer having a carrier concentration more than $10^{17}$ cm$^{-3}$, a second semiconductor layer having a carrier concentration less than $10^{16}$ cm$^{-3}$, a third semiconductor layer having a carrier concentration more than $10^{17}$ cm$^{-3}$ and a thickness less than 300 Å, a fourth semiconductor layer having a carrier concentration less than $10^{16}$ cm$^{-3}$ and a fifth semiconductor layer having a carrier concentration more than $10^{17}$ cm$^{-3}$ and, in which the first and fifth semiconductor layers are the same in conductivity type and the third semiconductor layer is different in conductivity type form the fifth semiconductor layer, characterized in that the energy gap of the third semicondutor layer is larger than the energy gaps of the second and fourth semiconductor layers.

In accordance with the present invention, there is further proposed a semiconductor element, which is formed by a sequential lamination of a first semiconductor layer having a carrier concentration more than $10^{17}$ cm$^{-3}$, a second semiconductor layer having a carrier concentration less than $10^{16}$ cm$^{-3}$, a third semiconductor layer having a carrier concentration more than $10^{17}$ cm$^{-3}$ and a thickness less than 300 Å, a fourth semiconductor layer having a carrier concentration less than $10^{16}$ cm$^{-3}$ and a fifth semiconductor layer having a carrier concentration more than $10^{17}$ cm$^{-3}$, and in which the first and fifth semiconductor layers are the same in conductivity type while the third semiconductor layer is different in conductivity type from the fifth semiconductor layer, characterized in that an annular region of the semi-insulating material or of the same conductivity type as that of the third semiconductor layer is formed around an active region to extend from the fifth semiconductor layer to the second semiconductor layer.

BRIEF DESCRIPTION OF THE ACCOMPANYING DRAWINGS

The present invention will be described in detail below in comparison with prior art with reference to the accompanying drawings, in which.

DETAILED DESCRIPTION

Figure 1A:
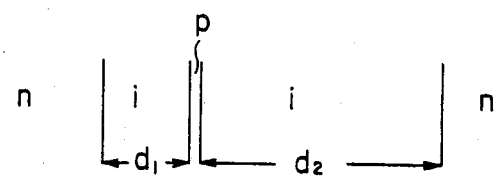
FIGS. 1A and 1B are the band structure of a conventional n-i-p-i-n device in its thermal equilibrium state and when voltage V is applied.
Figure 1A:
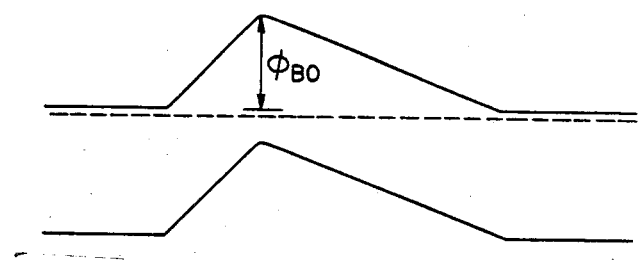
Figure 1B:
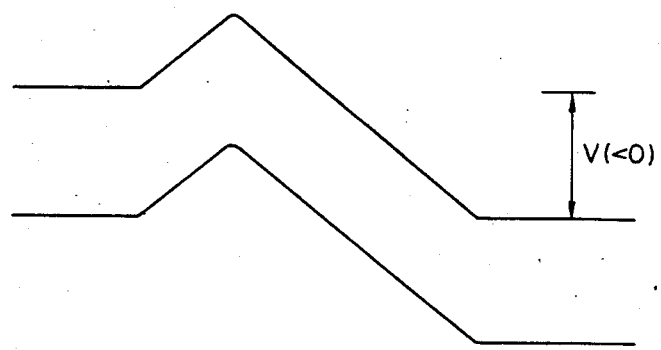

A description will be given first of the operation of the n-i-p-i-n device. FIGS. 1A and 1B show the thermal equilibrium state of a conventional n-i-p-i-n device using GaAs and its band structure when supplied with a voltage V, $\phi_{BO}$ representing the height of a potential barrier between the two n-layers. The density J of a current flowing upon application of the voltage V is expressed by the equation of thermionic emission:

$$J = A^*T^2 \exp\left(\frac{-q\phi_{BO}}{KT}\right) \left\{ \exp\left(\frac{q\alpha_2 V}{KT}\right) - \exp\left(\frac{-q\alpha_1 V}{kT}\right) \right\} \quad (1)$$

where A* is an effective Richardson's constant, T is an absolute temperature, k is the Boltzmann's constant, q is an electronic charge, and $\alpha_1$ and $\alpha_2$ are given by $\alpha_1 = d_1/(d_1+d_2)$ and $\alpha_2 = d_2/(d_1=d_2)$ where $d_1$ and $d_2$ are the thickness of the two i-layers. If $d_1 \neq d_2$, then the voltage-current characteristic becomes asymmetric. Therefore, this device is similar to an ordinary pn juntion diode.

In the absence of light irradiation, since no holes are injected into this device, its response speed is very high and the device is employed as an ultrahigh-speed device. On the other hand, when the device is exposed to irradiation by light, holes optically excited minority carriers center on the p-layer portion. This functions to reduce the value of the potential barrier $\phi_{BO}$, causing an increase in electron current flowing through the barrier. That is, the irradiation by light causes a flow of photocurrent; it has been reported that the sensitivity at this time is about 700 A/W, a nearly thousandfold increase in terms of gain. Further, as regards the response speed, a value of 50 to 500 ps has also been reported. Thus this device is employed as a very high-gain, high-speed photo detector.

With the conventional structure, however, for instance, n-i-p-i-n devices employing GaAs mostly have a barrier height of about 0.6 eV and, consequently, the current value in the reverse-biased condition (or dark current in the case of a photodetector) tends to be relatively large. The potential barrier $\phi_{BO}$ is obtained by solving the Poisson's equation and given by $$\phi_{BO} = \frac{d_1 \cdot d_2}{d_1 + d_2} \cdot \frac{N_A \cdot X_A}{\epsilon_s} q \qquad (2)$$

where $N_A$ is the acceptor concentration in the p-layer, $X_A$ is the thickness of the p-layer and $\epsilon_s$ is the dielectric constant. The value of the potential barrier $\phi_{BO}$ can be increased by (1) making a difference between $d_1$ and $d_2$ ($d_1 < d_2$) large and $d_1$ large, (2) making $N_A$ large and (3) making $X_A$ large. However, these solutions possess such defects as follows: Too large a value of $d_1$ prolongs the lifetime of the holes to adversely affect the high-speed response; too large a value of $N_A$ poses a problem in terms of crystal growth; and the p-layer is required only to serve as a barrier and too large a value of $X_A$ leads to a loss of the high-speed responsibility.

The present invention will hereinafter be described in detail in connection with its embodiments.

[EXAMPLE 1]

Figure 2:
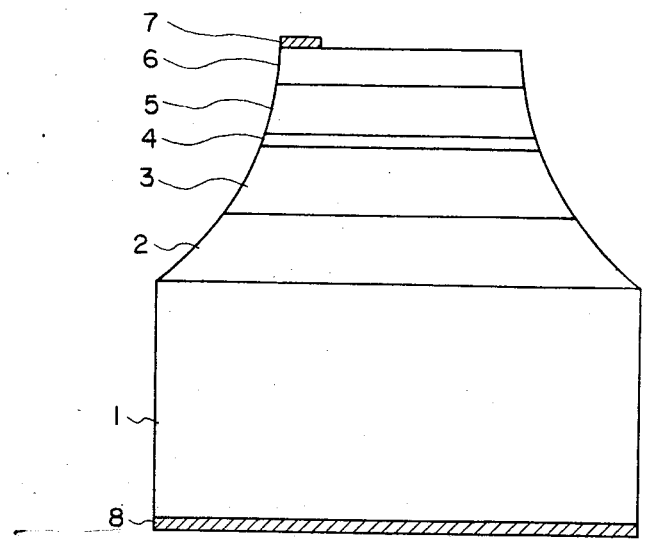
FIG. 2 is a cross-sectional view illustrating an embodiment of the present invention.
Figure 3:
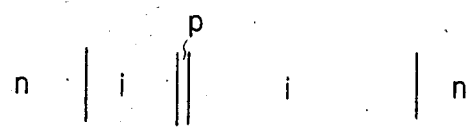
FIG. 3 is the band structure of the embodiment of FIG. 2 in its thermal equilibrium state.
Figure 3:
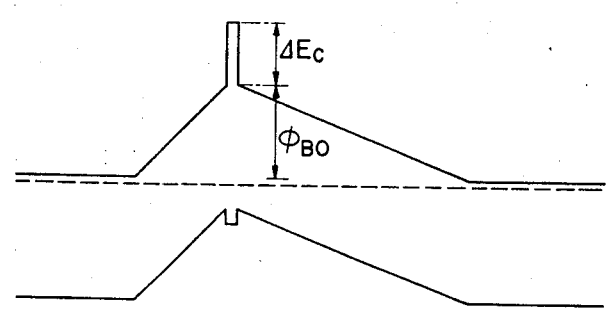

FIG. 2 illustrates, in cross-section, a mesa type n-i-p-i-n device of the present invention. Reference numeral 1 indicates an n+-GaAs substrate; 2 designates an n-GaAs layer ($n \simeq 10^{18} cm^{-3}$ and a thickness of about 1 μm); 3 identifies an i-GaAs layer ($p \simeq 10^{14} cm^{-3}$ and a thickness of about 2 μm); 4 denotes a p-GA$_{0.7}$Al$_{0.3}$As layer ($p \simeq 10^{18} cm^{-3}$ and a thickness of about 100 Å); 5 represents an i-GaAs layer ($n \simeq 10^{14} cm^{-3}$ and a thickness of about 1000 Å); 6 represents an n-GaAs layer ($n \simeq 10^{18} cm^{-3}$ and a thickness of about 1 μm) and 7 and 8 refer to electrodes. FIG. 3 shows the band structure of this device in its thermal equilibrium state. The potential barrier height as viewed from the n-layer 6 is larger than in the case of forming the n-i-p-i-n structure through using only GaAs substantially by a difference $\Delta Ec$ in the conduction band energy level between the GaAs and the Ga$_{0.7}$Al$_{0.3}$As. A difference $\Delta Eg$ in the energy band is $\sim 0.4$ eV in this case. If $\Delta Ec \simeq 0.85 \Delta Eg$, the $\Delta Ec$ 0.34 eV. If the other conditions are the same, the current density takes a value obtained when setting $\phi_{BO} + \Delta Ec$ for $\phi_{BO}$, and when $\Delta Ec \simeq 0.34$ eV, becomes about $10^{-6}$ times at room temperature, allowing a substantial reduction of the reverse current (the dark current).

[EXAMPLE 2]

Figure 4:
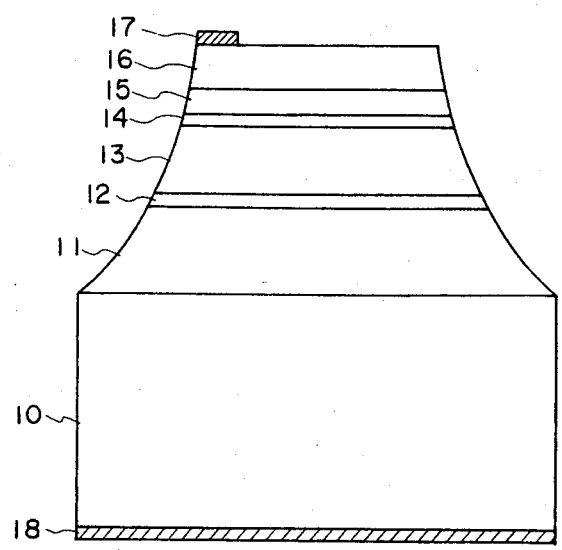
FIG. 4 is a cross-sectional view illustrating another embodiment of the present invention.
Figure 5:
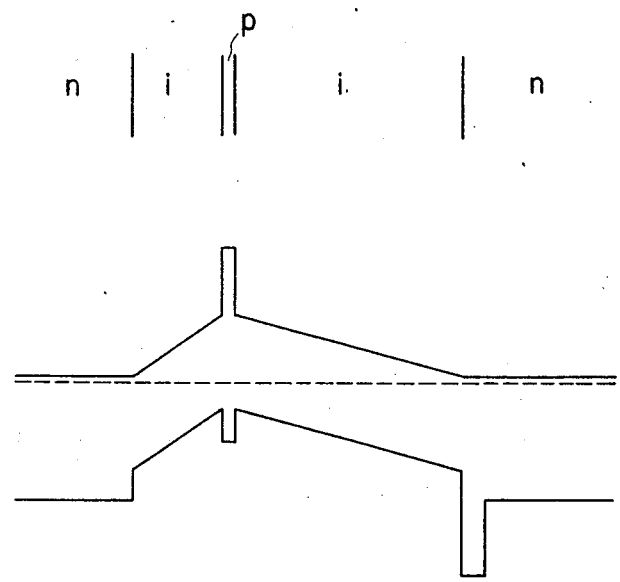
FIG. 5 shows the band structure of the embodiment of FIG. 4 in its thermal equilibrium state.

In Example 1 the semiconductor layers except the p-layer are of the same composition. This structure reduces the electron current but hardly affects the hole current. However, if it is used as a photo detector, since a ratio of the electron dark current to the hole dark current are related to its gain, the hole dark current has to be decreased. Example 2 shows the structure in which the hole current also decreases. FIG. 4 is a cross-sectional view of the semiconductor device of this Example, and this device was designed as a photo detector for a band of wavelengths of 0.9 to 1.7 μm. Reference numeral 10 indicates an n+-InP substrate; 11 designates an n-InP layer ($n \simeq 10^{18} cm^{-3}$ and a thickness of about 2 μm); 12 identifies an n-AlAs$_{0.4}$Sb$_{0.6}$ layer ($n \simeq 10^{18} cm^{-3}$ and a thickness of about 100 Å); 13 denotes an i-In$_{0.53}$Ga$_{0.47}$As layer ($n \simeq 10^{15} cm^{-3}$ and a thickness of about 1000 Å); 14 represents a p-AlAs$_{0.4}$Sb$_{0.6}$ layer ($p \simeq 10^{18} cm^{-3}$ and a thickness of about 100 Å); 15 shows an i-In$_{0.53}$Ga$_{0.47}$As layer ($n \simeq 10^{15} cm^{-3}$ and a thickness of about 1000 Å); 16 refers to an n-InP layer ($n \simeq 10^{18} cm^{-3}$ and a thickness of about 1 μm); and 17 and 18 signify electrodes. The energy band of the AlAs$_{0.4}$Sb$_{0.6}$ is about 1.9 eV, which is larger than the energy band gaps of the In$_{0.53}$Ga$_{0.47}$As and the InP. FIG. 5 shows the band structure of this device in its thermal equilibrium state. The provision of the p-AlAs$_{0.4}$Sb layer 14 increases the height of the potential barrier and causes a substantial reduction of the electron current. On the other hand, the provision of the n-AlAs$_{0.4}$Sb$_{0.6}$ layer 12 prevents a defect where holes generated in small quantities in the n-InP layer 11 are diffused and injected into the i-In$_{0.53}$Ga$_{0.47}$As layer 13, thereby reducing the dark current by the holes. That is, by forming two AlAs$_{0.4}$Sb$_{0.6}$ layers in the n-i-p-i-n structure, the dark currents by both of the electrons and holes can be reduced. Further, when applying light of 0.9 to 1.7 μm wavelength to this structure, the light is absorbed only by the two i-layers and is hardly absorbed by the n-layers on both sides, so that the response is high-speed. That is, it is possible with such a structure as shown in FIG. 4 to obtain a photo detector which is low in dark current and high-speed and high-gain.

While the above examples employ, as their materials, two combinations of the GaAs/GaAlAs series and the InP/ InGaAs/AlAsSb series, it is also possible, of course, to employ other combinations of semiconductors, for example, GaPSb, AlGaAsSb, AlInAsP, AlPSb and so forth. Further, the present invention is not limited specifically to the mesa type element but may also be applied to a planar type element and, moreover, it is also applicable to a p-i-n-i-p element.

Such structures can fully be fabricated by the molecular beam epitaxial growth method for crystal growth and by the prior art for other processes.

As has been described in the foregoing, according to the present invention, it is possible to manufacture an n-i-p-i-n device which is small in current, in other words, large in rise-up voltage, and which can widely be applied to an ultrahigh-speed device and a high sensitivity photo detector.

As has been described in detail, accordig to the present invention, it is possible to fabricate a planar type n-i-p-i-n element of stable operation characteristic in accordance with the present invention, which can widely be applied to an ultrahigh-speed device and a high sensitivity photo detector.

In case of practically producing n-i-p-i-n devices of the present invention, they have defects such as a large reverse current and an unstable operation due to influence of external, atmosphere if they are formed into mesa-types. Accordingly, devices of planar-type rather than mesa-types are required for stable operation. However, there have not yet been proposed n-i-p-i-n devices of planar-type.

The present invention will hereinafter be described in detail with respect to its embodiments of planar-types.

[EXAMPLE 3]

Figure 6A:
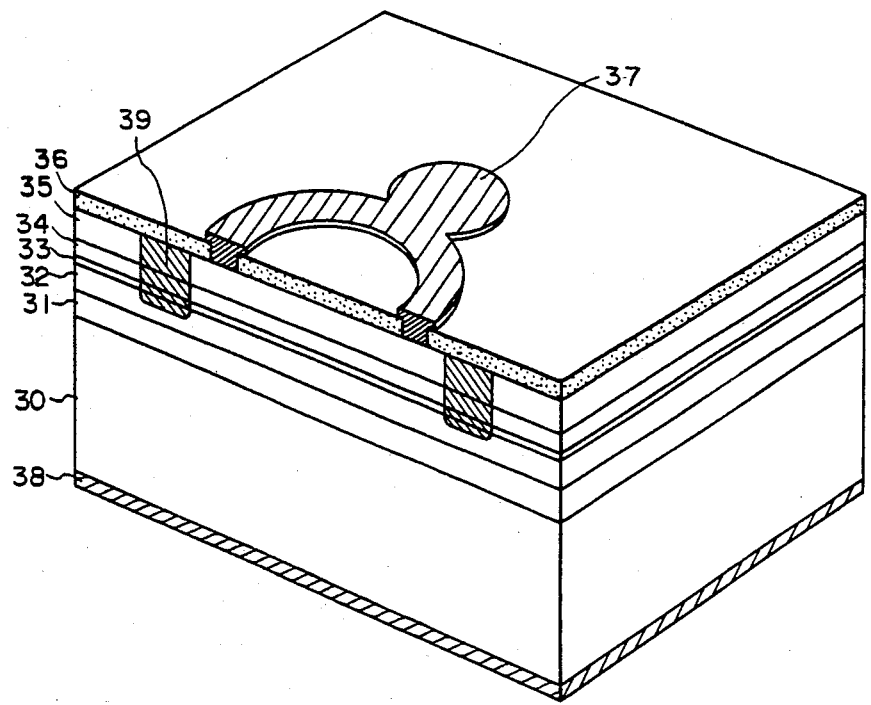
FIGS. 6A and 6B are respectively a perspective view and a cross-sectional view of a planar type n-i-p-i-n device embodying the present invention.
Figure 6B:
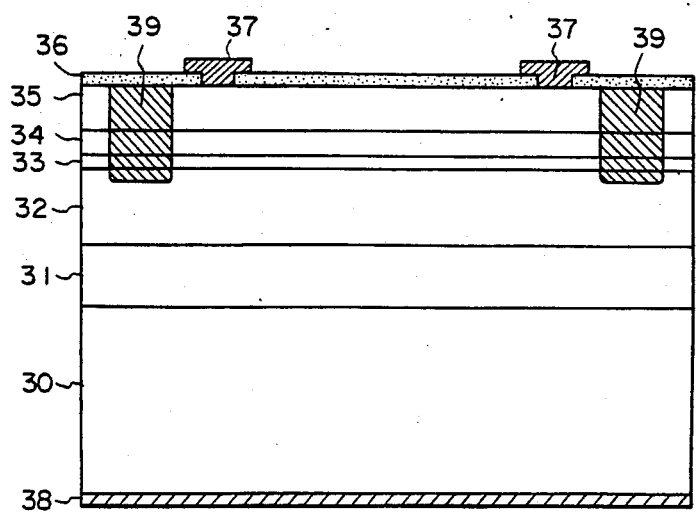

FIGS. 6A and 6B illustrate an embodiment of the planar type n-i-p-i-n device of the present invention, FIG. 6A being its perspective view including its cross-section and FIG. 6B its cross-sectional view. Reference numeral 30 indicates an n+-GaAs substrate; 31 designates an n-GaAs layer (n≃10$^{18}$cm$^{-3}$ and a thickness of about 1 μm); 32 identifies an i-GaAs layer (p≃10$^{14}$cm$^{-3}$ and a thickness of about 2 μm); 33 dnotes a p-GaAs layer (p≃10$^{18}$cm$^{-3}$ and a thickness of about 100 Å); 34 represents an i-GaAs layer (p≃10$^{14}$cm$^{-3}$ and a thickness of about 1000 Å); 35 shows an n-GaAs layer (n≃10$^{17}$cm$^{-3}$ and a thickness of about 1 μm); 36 refers to an insulating film; 37 and 38 signify electrodes; and 39 indicates an annular region formed by a p-type or semi-insulating semiconductor. The annular region 39 is formed to extend from the n-type layer 35 down to the i-type layer 32 in the portion surrounding an active region (a light receiving region in the case of a photo detector) in which a current flows. Now, in a case where the region 39 is formed of a p-type semiconductor, an n-p-n structure is formed to extend along the layer 35 and a p-i-n structure is formed between the region 39 and the n-type layer 31, so that when a voltage is applied in a manner to make the potential of the electrode 38 positive relative to the electrode 37, substantially no current flows outside the active region. Further, when the region 39 is formed of a semi-insulating semiconductor, there is no appreciable current flow through the region 39 naturally. That is, a current centers only to the active region inside the region 39, and the electrostatic capacitance also takes the value which is dependent substantially upon the area of the active region. With this structure, the p-type layer which forms the barrier in the active region is not exposed to the outside, and hence it is not affected by the outside, resulting in reduced leakage current and stabilized operation. In other words, the introduction of the region 39 ensures to provide a planar type device which is identical in operation with the mesa type device and stable and high in performance.

[EXAMPLE 4]

Figure 7:
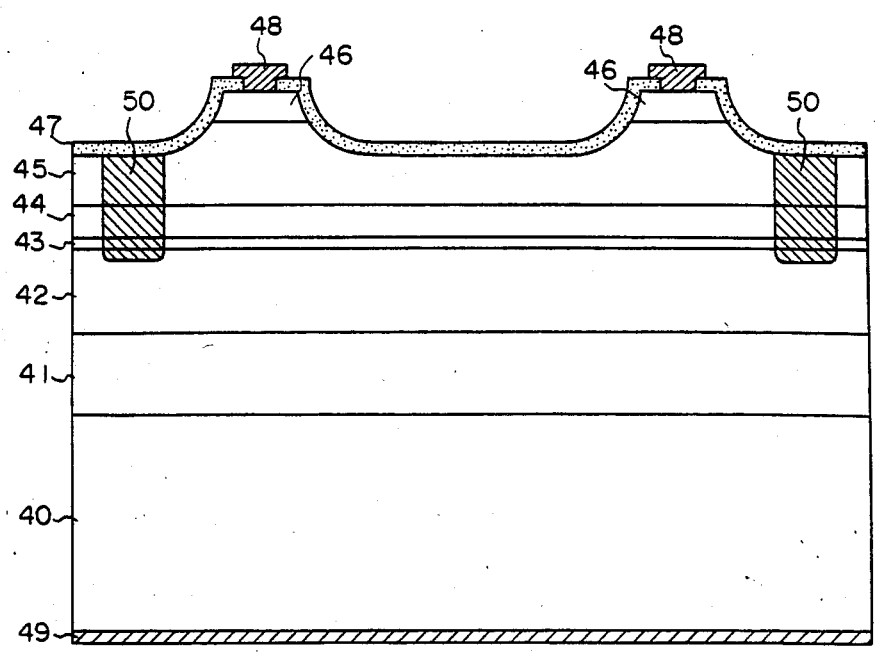
FIG. 7 is a cross-sectional view showing a device of a partly modified layer structure of the device depicted in FIGS. 6A and 6B.

Next, a description will be given of another embodiment of the present invention. In the abovesaid Example 3, the carrier concentration of the n-type layer 35 is relatively high, so that if the region 39 is formed as a p-type region, the breakdown voltage of the pn junction between it and the layer 35 may sometimes be low and , in this case, there is the possibility of a current flowing through the n-p-n structure along the layer 35. Example 4 has a structure for preventing such a leakage current. FIG. 7 shows its cross-sectional view. Reference numeral 40 indicates an n+-GaAs substrate; 41 designates an n-GaAs layer (n≃10$^{18}$cm$^{-3}$ and a thickness of about 1 μm); 42 identifies an i-GaAs layer (p≲10$^{14}$cm$^{-3}$ and a thickness of about 2 μm); 43 denotes a p-GaAs layer (p≃10$^{18}$cm$^{-3}$ and a thickness of about 100 Å); 44 represents an i-GaAs layer (p≲10$^{14}$cm$^{-3}$ and a thickness of about 1000 Å); 45 shows an n-Ga$_{0.8}$Al$_{0.2}$As layer (p≃10$^{15}$cm$^{-3}$ and a thickness of about 1 μm); 46 refers to an annular n-GaAs layer (n≃10$^{18}$cm$^{-3}$ and a thickness of about 1 μm) for facilitating the connection to the corresponding electrode; 47 signifies an isulating film; 48 and 49 indicate electrodes; and 50 designates an annular region formed of a p-type or semi-insulating semiconductor to extend from the layer 45 down to the layer 42 around the active region. Since the n-type layer 45 is formed of the Ga$_{0.8}$Al$_{0.2}$As of larger energy gap than the GaAs and has a low carrier concentration, even if the region 50 is formed of a p+-type semiconductor, its breakdown voltage can be made large and, consequently, substantially no current flows through the region 50 regardless of its acceptor concentration.

Incidentally, in a case where the regions 49 and 50 are formed of the p-type semiconductor in Examples 3 and 4, it is also possible to attach thereto electrodes so that a voltage may be applied to provide a reverse-biased condition between the region 49 and the layer 45, or between the region 50 and the layer 45. In this case, the potential barrier at the vicinity portion of the active region becomes higher than the potential barrier at the central portion, reducing the value of a current flowing through the vicinity portion.

While in the foregoing the GaAs is employed as the material of the semiconductor element, mixed crystals, such as GaAlAs, InGaAsP, InGaAlAs and so forth, can also be used. Furthermore, it is possible not only to produce the n-i-p-i-n device with a material of a single composition but also to fabricate an n-i-p-i-n device of a hetero structure through using materials of different compositions. Moreover, the above-described structures is also applicable to a p-i-n-i-p device with reverse conduction types.

Since such structures can be formed by using the molecular beam epitaxial growth method for crystal growth and the ion implantation or impurity diffusion method for the annular region, the device of the present invention can easily be produced by conventional manufacturing methods.

What we claim is:

1. A multilayered semiconductor photodetector formed by a sequential lamination of a first semiconductor layer having a carrier concentration more than 10$^{17}$ cm$^{-3}$, a second semiconductor layer having a carrier concentration less than 10$^{16}$ cm$^{-3}$, a third semiconductor layer having a carrier concentration more than 10$^{17}$ cm$^{-3}$ and a thickness less than 300 Å, a fourth semiconductor layer having a carrier concentration less than 10$^{16}$ cm$^{-3}$ and a fifth semiconductor layer having a carrier concentration more than 10$^{17}$ cm$^{-3}$, said first semiconductor layer and said fifth semiconductor layer being of the same conductivity type, said third semiconductor layer being different in conductivity type from said fifth semiconductor layer, said second semiconductor layer and said fourth semiconductor layer being intrinsic, one of said second semiconductor layer and said fourth semiconductor layer being a light absorbing layer, and electrodes being provided to apply an electric field across said layers between said first semiconductor layer and said fifth semiconductor layer, the bandgaps of said first semiconductor layer and said fifth semiconductor layer being greater than those of said second semiconductor layer and said fourth semiconductor layer, and the bandgap of said third semiconductor layer being such that a potential barrier caused by a difference between bandgaps of said third semiconductor layer and said light absorbing layer effectively prevents a dark current caused by majority carriers in said first semiconductor layer and said fifth semiconductor layer.

2. A multilayered semiconductor photo detector according to claim 1, in which said first semiconductor layer and said fifth semiconductor layer are of the n-conductivity type while said third semiconductor layer is of the p-conductivity type.

3. A multilayered semiconductor photo detector according to claim 1, in which said first semiconductor layer and said fifth semiconductor layer are of the p-conductivity type while said third semiconductor layer is of the n-conductivity type.

* * * * *